United States Patent
Hechtfischer et al.

(10) Patent No.: US 7,088,089 B2
(45) Date of Patent: Aug. 8, 2006

(54) POWER DETECTOR WITH CONSTANT VOLTAGE DECOUPLING

(75) Inventors: Gerd Hechtfischer, Munich (DE); Michael Katzer, Munich (DE)

(73) Assignee: Rohde & Schware GmbH & Co. KG, München (DE)

( * ) Notice: Subject to any disclaimer, the term of this patent is extended or adjusted under 35 U.S.C. 154(b) by 0 days.

(21) Appl. No.: 10/504,001

(22) PCT Filed: Jan. 28, 2003

(86) PCT No.: PCT/EP03/00857

§ 371 (c)(1),
(2), (4) Date: Jan. 13, 2005

(87) PCT Pub. No.: WO03/067270

PCT Pub. Date: Aug. 14, 2003

(65) Prior Publication Data

US 2005/0116701 A1     Jun. 2, 2005

(30) Foreign Application Priority Data

Feb. 8, 2002   (DE) ............................... 102 05 359

(51) Int. Cl.
  *G01R 21/04* (2006.01)
  *H01P 5/19* (2006.01)
(52) U.S. Cl. ......................... 324/95; 333/110
(58) Field of Classification Search ............ None
See application file for complete search history.

(56) References Cited

U.S. PATENT DOCUMENTS

| | | | | |
|---|---|---|---|---|
| 2,443,097 A | * | 6/1948 | Crosby | .......................... 324/95 |
| 2,522,563 A | * | 9/1950 | Blitz | .......................... 324/645 |
| 2,562,281 A | * | 7/1951 | Mumford | ...................... 324/95 |
| 2,925,556 A | * | 2/1960 | Schimmel | ..................... 324/95 |
| 3,447,082 A | * | 5/1969 | Calderhead | ................. 324/106 |
| 3,755,735 A | | 8/1973 | Biagi et al. | |
| 4,873,484 A | | 10/1989 | Adam | |
| 4,943,764 A | | 7/1990 | Szente et al. | |
| 5,302,024 A | * | 4/1994 | Blum | .......................... 374/122 |
| 5,467,013 A | * | 11/1995 | Williams et al. | ............ 324/127 |

FOREIGN PATENT DOCUMENTS

| | | |
|---|---|---|
| DE | 1 103 459 | 3/1961 |
| DE | 36 44 205 | 7/1988 |
| DE | 39 27 114 | 2/1991 |
| DE | 42 39 740 | 6/1994 |
| DE | 693 22 930 | 6/1999 |
| DE | 693 24 459 | 11/1999 |
| DE | 694 19 088 | 12/1999 |
| DE | 100 39 665 | 2/2002 |
| EP | 0 503 200 | 9/1992 |
| EP | 0 742 649 | 11/1996 |
| WO | WO 01/65267 | 9/2001 |
| WO | WO 02/14880 | 2/2002 |

\* cited by examiner

Primary Examiner—Ernest Karlsen
(74) Attorney, Agent, or Firm—Ditthavong & Mori, P.C.

(57) ABSTRACT

A power detector for measuring the average power, without constant voltage, of modulated or unmodulated high frequency or microwave signals is described. The power detector includes a signal line connected to a high frequency input. A detection line is capacitively and/or inductively coupled to the signal line and, seen in the longitudinal direction, is connected to the signal line. The signal is tapped from the detection line at two or more detection positions which are staggered in the longitudinal direction.

19 Claims, 3 Drawing Sheets

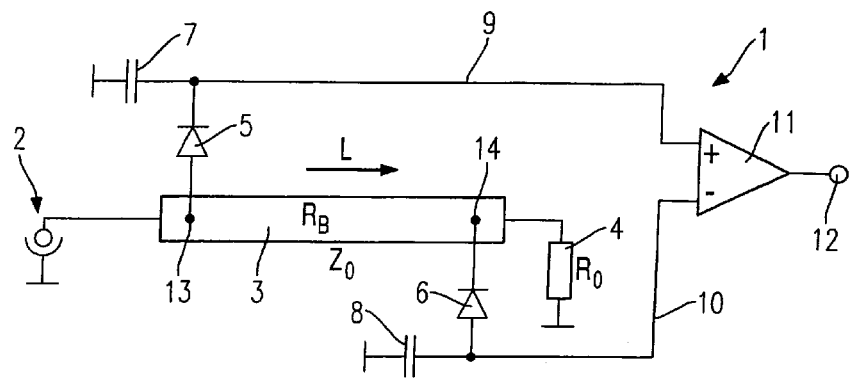
Fig. 1 (Stand der Technik)
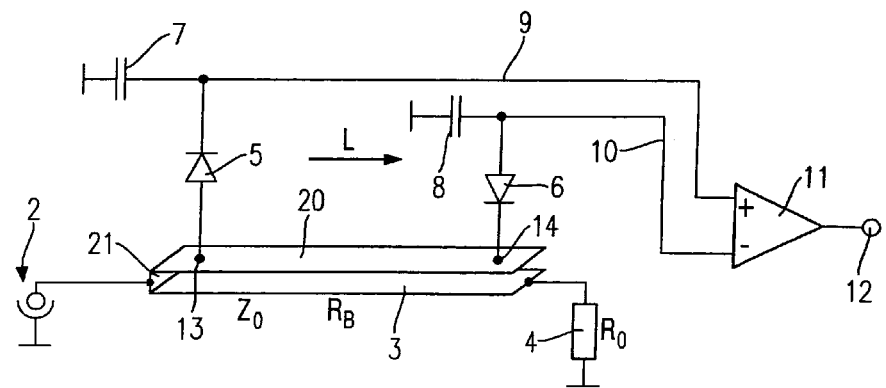
Fig. 2
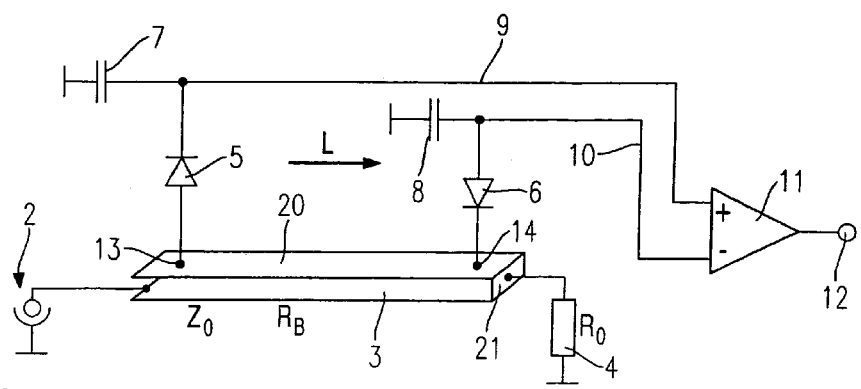
Fig. 3

Fig. 4
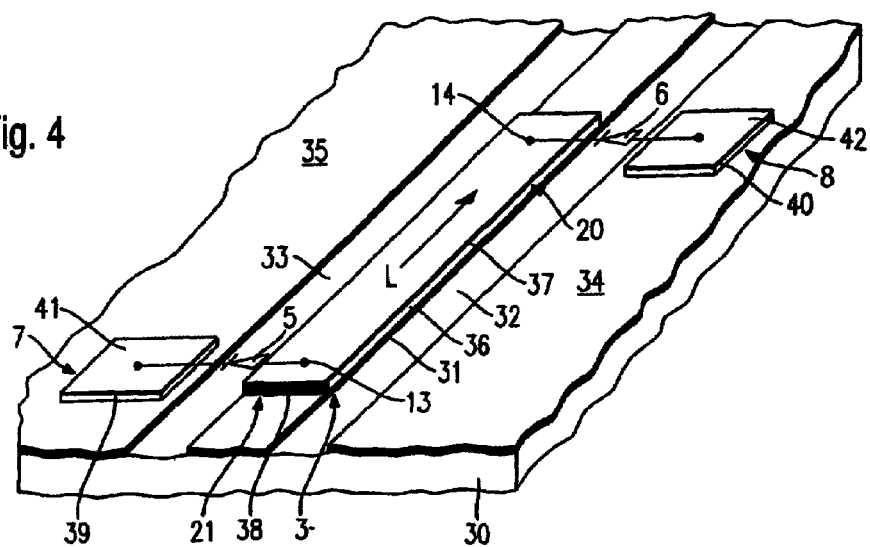
Fig. 5
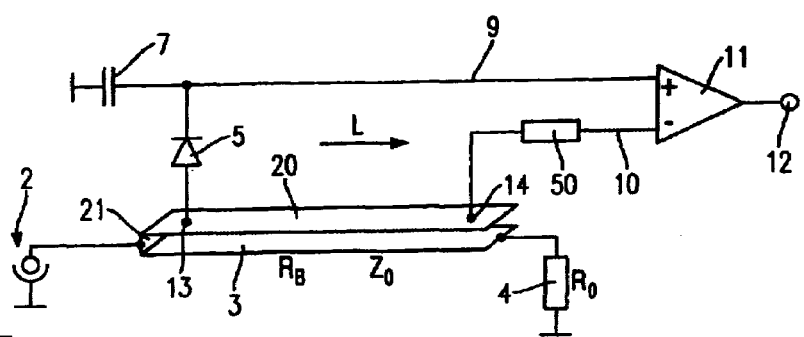
Fig. 6

POWER DETECTOR WITH CONSTANT VOLTAGE DECOUPLING

CONTINUING DATA

This application is a 371 of PCT/EP03/00857 filed Jan. 28, 2003.

FIELD OF THE INVENTION

The invention relates to a power detector for measuring the average power of modulated or un-modulated high-frequency and/or microwave signals.

BACKGROUND OF THE INVENTION

Power detectors are already well known in an extremely diverse range of embodiments. The most frequently used realisations contain either a thermal sensor, which generates an electrical measurement parameter proportional to the absorbed electrical power, or they contain a diode regulator in a one-way or two-way circuit, which supplies an electrical output parameter equivalent to the voltage at the terminal resistance, from which the power to be measured can then be determined.

In particular, the demands of the communications standards and the second and third generations of mobile telephones have led to the development of a new group of power detectors with a substantially greater dynamic range for modulated signals.

A power detector of this kind is known, for example, from the previously unpublished DE 100 39 665 of the applicant. In the case of the power detector described in this application, a stripline without electrical isolation is connected directly to the input terminal. The stripline terminates with a power distributor. A detector diode, which detects the positive and the negative half-wave of the measured signal in each case is disposed at the input and output ends of the stripline. The detector diodes can be connected to a difference amplifier in order to register the measured signal. As described in the application, a spatial isolation of the detector diodes has the advantage that the arrangement is less sensitive to reflections. The difference between the output voltages at the two detector diodes is therefore less dependent on the adaptation of the power distributor and the parasitic diode capacities. Other measurement branches with series connected attenuation stages are connected to the power distributor, so that a relatively large dynamic range is achieved in combination.

However, if the measured signal is associated with a direct-voltage component, a considerable measurement error occurs because of the direct-current-resistance of the stripline connecting the detector diodes and the associated drop in voltage.

Hitherto, it has been conventional to suppress the direct-voltage components of the measured signal with an isolating capacitor arranged between the high-frequency terminal and the detector diodes. An isolating capacitor of this kind is used, for example, in U.S. Pat. No. 4,943,764. Furthermore, with the solution proposed in this document, several diode pairs isolated from one another by power distributors are used to increase the dynamic range. However, the detector diodes pick up the two half-waves at the same measurement point. Accordingly, the relative insensitivity to reflections, which results from a spatial isolation of the detector diodes, as suggested in DE 100 39 665, is not available in this context.

The use of an isolating capacitor to suppress the direct-voltage component of the measured signal has several disadvantages. Firstly, the capacity of the isolating capacitor must be relatively large, in order to achieve a low lower-threshold frequency thereby allowing a broadband realisation of the power detector. This leads to a mechanically relatively large structure. Secondly, the isolating capacitor must be integrated in a low-reflection high-frequency line for microwave applications. This leads to additional interference reflections and therefore also to greater measurement errors.

SUMMARY OF THE INVENTION

The present invention addresses a need for providing a power detector, which is relatively insensitive to a direct-voltage component and at the same time insensitive to reflections, for example, on a terminal resistance or a power distributor.

The invention is based on the knowledge that a direct voltage de-coupling can be achieved by placing the pickups for the detector elements, for example, the detector diodes, not directly on the signal line, but on a detection line, which is coupled to the signal line in a capacitive and/or inductive manner. In theory, the detection line could be completely electrically isolated from the signal line. However, it is advantageous to connect the detection line to the signal line at only one contact position, and in this manner to provide a defined reference potential. Under no circumstances, however, should more than one contact position be provided along the longitudinal direction of the signal line, so that no direct current flows in the detection line, and an optionally present drop in voltage at the direct-current-resistance of the signal line does not lead to a drop in voltage in the detection line. The voltage pickups at the detection positions of the detection line are therefore at the same direct voltage potential and a direct-voltage component of the measured signal does not lead to a measurement error.

The contact position between the signal line and the detection line can be disposed at any desired position, for example, in one of the two terminal regions of the lines.

The detection line can be attached to the signal line using thin-layer, multi-layer technology with the interposition of a thin insulating layer. In principle, the signal line and the detector line could also be designed as coupled lines alongside one another in a coplanar manner.

It is advantageous if the line impedance of the detection line is relatively low and is in the same order of magnitude as the direct-current-resistance of the signal line. Even if the non-terminated detection line is resonant for individual measurement frequencies, strongly disturbing resonances do not occur because of the low circuit quality as a result of the high attenuation.

The further development according to the invention is suitable for two-way rectifiers each with only one detector diode for both half-waves and also for one-way rectifiers with only one detector diode, wherein the reference potential for the difference amplifier can be picked up at a pickup position on the detection line, which is offset relative to the pickup position of the detector diode.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Several exemplary embodiments of the invention will be described in greater detail below with reference to the drawings. The drawings are as follows:

FIG. 1 shows a schematic diagram of the solution for the arrangement of detector diodes suggested in the previously unpublished application DE 100 39 665;

FIG. 2 shows a schematic diagram of a first exemplary embodiment of the invention;

FIG. 3 shows a schematic diagram of a second exemplary embodiment of the invention;

FIG. 4 shows a possible realisation of the first exemplary embodiment of the invention as presented in FIG. 2 using coplanar technology;

FIG. 5 shows a schematic diagram of a third exemplary embodiment of the invention;

FIG. 6 shows a schematic diagram of a fourth exemplary embodiment of the invention and FIG. 7 shows a schematic diagram of a fifth exemplary embodiment of the invention with several measurement branches to increase the dynamic range.

DETAILED DESCRIPTION OF THE PREFERRED EMBODIMENT

Figure 7:
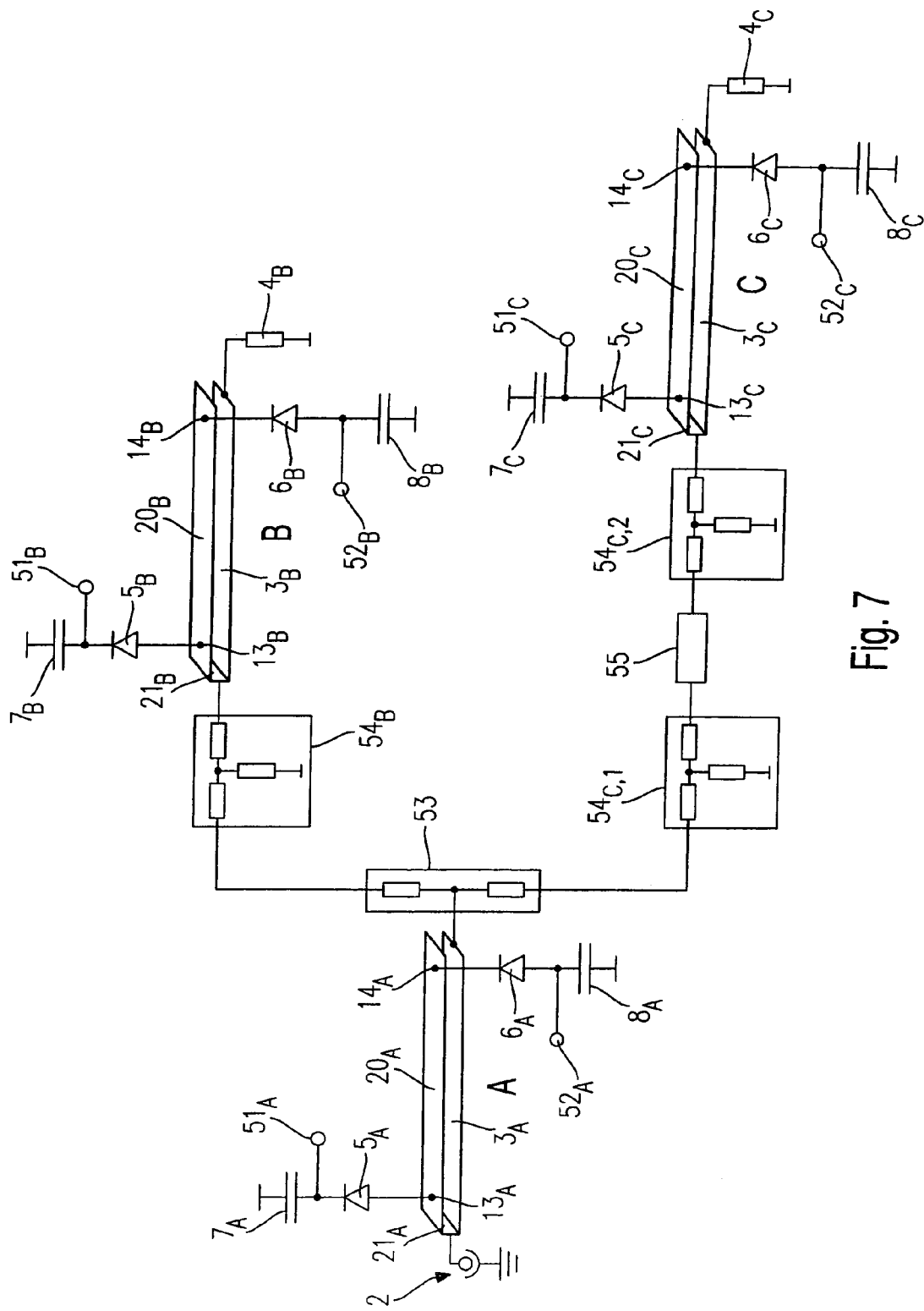

FIG. 1 shows a schematic diagram of a solution with an offset arrangement of the detector diodes of a power detector 1, as proposed in the previously unpublished application DE 100 39 665 of the applicant.

A high-frequency input 2 is connected to a signal line 3, which has a direct-current-(DC)-resistance $R_B$ and terminates with a terminal-resistance 4, which has the resistance value $R_0$. Furthermore, a first detector diode 5, which is connected by its anode to the signal line 3, and a second detector diode 6, which is connected by its cathode to the signal line 3, are provided. At each connection of the detector diodes 5 and 6 disposed opposite to the signal line 3, a charging capacitor 7 and/or 8 and a supply line 9 and/or 10 for the difference amplifier are provided. The first detector diode 5 supplies an output voltage corresponding to the measured signal of positive polarity relative to earth, while the second detector diode supplies an output voltage corresponding to the measured signal of negative polarity relative to earth. The difference amplifier 11 suppresses any direct voltage components superimposed on the measured signal and therefore on both output voltages, so that, at its output 12, a measured signal is available, which is proportional to the power of the measured signal, provided the detector diodes 5 and 6 are adjusted in their quadratic range.

The resistance value $R_0$ of the terminal resistance 4 is, in general, adapted to the line impedance $Z_0$ of the signal line 3. In the context of DE 100 39 665, this terminal resistance is formed by a power distributor, which allows a branching into further measurement branches, which have been omitted in the present context for the sake of simplicity.

In practice, a completely reflection-free termination of the signal line 3 cannot be achieved. Slight reflections may occur even at the detection positions 13 and 14 of the detector diodes 5 and 6. The effect of these reflections can be reduced by means of an offset in the longitudinal direction of the detection positions 13 and 14, as suggested for the first time in the previously unpublished DE 100 39 665 A1 of the applicant. It can be assumed that the distance between the detection positions 13 and 14 for the maximum frequency of the measured signal to be measured is approximately λ/4, wherein λ signifies the wavelength. If reflections occur, for example, at the terminal resistance 4, then the phase difference between the incident and the reflected wave at the detection position 13 is displaced by approximately 180° relative to the detection position 14.

This means that incident and reflected waves are superimposed, for example, at the detection position 13, in a destructive manner, while they are superimposed at the detection position 14 in a constructive manner. The positive measurement voltage at the detector diode 5 is accordingly somewhat reduced, while the negative measurement voltage at the detector diode 6 is somewhat increased in magnitude. By addition of the values of the two measured voltages in the difference amplifier 11, these effects are compensated relative to one another, so that, at least for the maximum measured frequency, a lower sensitivity to reflections is provided. For lower measurement frequencies, the compensation is no longer complete; however, with declining frequency, the reflection factor declines anyway, and accordingly, the need for compensation exists primarily at the upper end of the measurement frequency band.

However, the offset arrangement of the detection positions 13 and 14 on the signal line 3 has the disadvantage that, because of the voltage drop at the direct-current-resistance $R_B$ of the signal line 3, the detection positions 13 and 14 are not at exactly the same potential, if the measured signal at the high-frequency input 3 has a direct-voltage component. The detector diodes 5 and 6 typically have a rectifier sensitivity s=800 µV/µW, that is to say, with a supplied high-frequency power of 1 µW, there is a rectified voltage of 800 µV, wherein a linear relationship between the high-frequency power to be measured and the detected measured voltage can be assumed for small high-frequency powers (quadratic characteristic range). The direct-current-resistance $R_B$ between the two detector diodes 5 and 6 is typically $R_B$=0.5Ω. The terminal resistance $R_0$ is adapted to the impedance of the signal line 3 and is typically $R_0$=50Ω.

The lower measurement threshold of detector diodes of this kind is approximately 0.1 nW. Now, if a measured signal with a direct voltage component of $U_{DC}$=1 mV is provided at a high-frequency input 2, then there will be a difference voltage of 10 µV across the detector diodes 5, 6 at the difference amplifier 11 because of the voltage distribution between the terminal resistance $R_0$ and the direct-current-resistance $R_B$. This corresponds to an erroneously detected high-frequency power of 10 nW; that is to say, the drop in direct voltage at the resistance $R_B$ is erroneously detected as a high-frequency power of 10 nW at the input, which exceeds the possible lower measurement threshold of 0.1 nW by a factor of 100.

As already explained, the insertion of a isolating capacitor between the high-frequency input 2 and the signal line 3 would also be disadvantageous. This would have to be of a relatively large dimension in order to achieve a low lower-threshold frequency for a broadband design of the power detector. On the other hand, the isolating capacitor would have to be integrated into the signal line, which would lead to additional interfering reflections and therefore greater measurement errors.

FIG. 2 shows a diagram of a first exemplary-embodiment of a power detector 1 according to the invention. Identical or corresponding components are indicated in all drawings with the same reference numbers, to avoid repetition of description.

According to the invention, it is proposed that the detection positions for the detector diodes 5 and 6 and/or other detector elements should not be provided directly on the signal line 3 but rather on a detection line 20. The detection line 20 in the exemplary embodiment presented in FIG. 2 is connected to the signal line 3 by a contact position 21 arranged at an end region facing towards a high-frequency input 2. At all other positions, the detection line 20 is electrically isolated from the signal line 3. It is important that only one contact position 21 is present along the longitudinal direction of the signal line 3. Because the input resistances of the difference amplifier 11 are of very high-resistance, no significant current flows in the detection line 20, and the entire detection line 20 is at a uniform direct voltage potential. Accordingly, there is no voltage drop between the detection positions 13 and 14. The connection of the detection line 20 to the signal line 3 at exactly one contact position, seen in the longitudinal direction, is advantageous, because as a result, the detection line 20 is placed at a defined reference potential. It is also important that the detection line 20 is coupled to the signal line 3 so firmly in a capacitive and/or inductive manner, that, with reference to the longitudinal coordinate L, a voltage distribution of a high-frequency signal present on the detection line 20 is similar to that on the signal line 3.

FIG. 3 shows-a second exemplary embodiment of the invention. By contrast with the exemplary embodiment shown in FIG. 2, the contact position 21 in this exemplary embodiment is not disposed at the input end of the detection line 20 facing towards the high-frequency input, but at the output end of the detection line 20 facing towards the terminal resistance 4. FIGS. 2 and 3 present only two examples of the arrangement of the contact position 21. The contact position 21 may be located at any desired position in the longitudinal extension of the detector line 20.

FIG. 4 shows a possible realisation of the exemplary embodiment presented in FIG. 2 using thin-layer multi-layer technology. The signal line 3, which, in the exemplary embodiment is realised as a coplanar stripline, is disposed on a substrate 30 made from a dielectric. The signal line 3 is therefore a thin stripline 31, generally made from a metal, which in each case is isolated by a distance 32 and/or 33 from a metallic earth surface 34 and 35 respectively, each carrying an earth potential. A thin insulation layer 36 made from a suitable dielectric, for example, silicon nitride or silicon oxide, is disposed on the stripline 31, which forms the signal line 3. A further stripline 37, which forms the detection line 20, is disposed above the insulation layer 36. The detection line 20 is only connected to the signal line 3 at the contact position 21, which is formed by a metallic coating 38. At all other positions along a longitudinal direction L, the detection line 20 is electrically isolated from the signal line 3 and only coupled in a capacitive manner via the thin dielectric insulation layer 36.

The detection diodes 5 and 6 are shown only schematically in FIG. 4. Furthermore, the charging capacitors 7 and 8, which are designed as thin-layer capacitors, are also shown. The base electrode of the thin-layer capacitors is formed from a part of the earth surfaces 35 and/or 34, above each of which a thin insulation layer 39 and/or 40, preferably made from the same material as the insulation layer 36, is disposed in the place of the charging capacitors 7 and/or 8. A metallic layer 41 and/or 42 is disposed above the insulation layer 39 and/or 40 respectively. Since the local form of the insulation layers 39, 40 above the first metallic coating and a second metallic coating arranged above that, is necessary anyway for the manufacture of the thin-layer condensers 7 and/or 8, manufacturing the detection line 20 isolated from the signal line 3 by the insulation layer 36 does not represent an additional expenditure and can be realised using the same technology with a variation of the manufacturing masks.

While the exemplary embodiments according to the invention shown in FIGS. 2 to 4 are presented for a two-way rectifier, FIGS. 5 and 6 show two exemplary embodiments of a one-way rectifier with only one detector diode 5, which is arranged at the detection position 13. The other detection position 14 is connected via a resistance 50 in each case to the other input of the difference amplifier 11. The exemplary embodiments shown in FIGS. 5 and 6 differ again in that the contact position 21 in the exemplary embodiments shown in FIG. 5, is disposed at the end facing towards a high-frequency input 2, and in the exemplary embodiment shown in FIG. 6, is disposed at the end of the detection line 20 facing towards the terminal resistance. With a one-way rectifier, it is also important that the reference potential tapped via the resistance 50 and supplied to the difference amplifier 11 is at the same direct-voltage potential as the pickup of the detector diode.

FIG. 7 shows a further exemplary embodiment of the invention. In the exemplary embodiment shown in FIG. 7, three measuring branches A, B and C are provided in order to increase the dynamic range, as suggested in principle in the previously unpublished application DE 100 39 665 of the applicant. Each measuring branch A in the exemplary embodiment comprises two detector diodes $5_A$, $6_A$, $5_B$, $6_B$, $5_C$ and $6_C$ respectively, which tap the signal, as described with reference to FIG. 2, at the detection positions $13_A$, $14_A$, $13_B$, $14_B$, $13_C$ and $14_C$ respectively of the detection line $20_A$, $20_B$ and $20_C$. As described with reference to FIG. 2, the detection lines $20_A$, $20_B$ and $20_C$ are coupled in a capacitive and/or inductive manner to the signal lines $3_A$, $3_B$ and $3_C$ respectively and are connected electrically to the signal lines only at one contact position $21_A$, $21_B$ and $21_C$ respectively. The measuring points $51_A$, $52_A$, $51_B$, $52_B$, $51_C$ and $52_C$ are each connected to a difference amplifier, which is not illustrated in FIG. 7.

The signal line $3_A$ of the first measurement branch A is connected to the high-frequency input 2 without the intermediate connection of a isolating capacitor and, at the output end, is connected to a power distributor 53, which evenly distributes the power to the second measuring branch B and the third measuring branch C. A first attenuation element $54_B$, which attenuates the output power of the power distributor 53 by a defined attenuation factor, is disposed between the input of the signal line $3_B$ of the second measuring branch B and one of the outputs of the power distributor 53. The output of the signal-line $3_B$ terminates with a terminal resistance $4_B$.

The input of the signal line $3_C$ of the third measuring branch C in the exemplary embodiment is connected via two series arranged attenuation elements $54_{C,1}$ and $54_{C,2}$, to the other output of the power distributor 53. The attenuation elements $54_{C,1}$ and $54_{C,2}$ are preferably somewhat spatially isolated by a line 55 to avoid any direct crosstalk from the input of the attenuation element $54_{C,1}$ to the output of the attenuation element $54_{C,2}$. The signal line $3_C$ terminates with a terminal resistance $4_C$.

The measured signal is accordingly supplied to the signal lines $3_A$ and $3_B$ and $3_C$ of the different measurement branches A, B and C with a different attenuation, so that the measuring branch A is suitable for measurement in the lower power range, the measuring branch B is suitable for measurement in the medium power range and measuring branch C is suitable for measuring in the upper power range.

The invention is not restricted to the exemplary embodiments presented. For example, the signal line 3 and the detection line 20 should be designed as inductively coupled microstriplines adjacent to one another with only one metallic coating on the upper side of the substrate 30, wherein the substrate has only one continuous metallic earth on the underside, as is conventional with microstriplines.

While the present invention has been described in connection with a number of embodiments and implementations, the present invention is not so limited but covers various obvious modifications and equivalent arrangements, which fall within the purview of the appended claims.

The invention claimed is:

1. A power detector for measuring the direct-voltage-free power of modulated or un-modulated high-frequency or microwave signals comprising:
   a signal line connected to a high-frequency input; and
   a detection line coupled to the signal line in a firm capacitive and/or inductive manner such that, with reference to the longitudinal coordinate, a similar voltage distribution of the high-frequency signal is present on the detection line as on the signal line, wherein the signal on the detection line is tapped at least at two detection positions offset in a longitudinal direction,
   wherein the detection line is connected to the signal line only at one contact position along the longitudinal direction and is otherwise isolated from the signal line.

2. A power detector according to claim 1, wherein:
   the signal line and the detection line are designed as striplines arranged one above the other and isolated from one another by a thin insulation layer except at the contact position.

3. A power detector according to claim 2, wherein:
   the striplines forming the signal line and the detection line are spaced at a distance from earth surfaces and, together with the earth surfaces, form coplanar striplines.

4. A power detector according to claim 1, wherein:
   the detection line and the signal line are coupled to form a two-wire line with a line impedance approximately equivalent to the direct current resistance of the signal line.

5. A power detector according to claim 4, wherein:
   the line impedance of the two-wire line is within a range of 0.1 to 10-times, preferably of the 0.2 to 5-times and by particular preference 0.5 to 3-times the direct current resistance of the signal line.

6. A power detector according to claim 5, wherein:
   the line impedance of the two-wire line is within a range of 0.2 to 5-times the direct current resistance of the signal line.

7. A power detector according to claim 6, wherein:
   the line impedance of the two-wire line is within a range of 0.5 to 3-times the direct current resistance of the signal line.

8. A power detector according to claim 4, wherein:
   the line impedance of the two-wire line is selected to be so small that no disturbing resonances occur within the frequency range of a measured signal supplied to the high-frequency input.

9. A power detector according to claim 1, wherein:
   the contact position is arranged in the proximity of one of the two ends of the detection line.

10. A power detector according to claim 1, wherein:
    the length of the detection line is approximately one quarter of a wavelength of a highest frequency of a measured signal supplied to the high-frequency input.

11. A power detector according to claim 1, wherein:
    one detection position is arranged in the proximity of each of the two ends of the detection line.

12. A power detector according to claim 1, wherein:
    two detection positions are each connected via a detector diode in mutually opposing polarity to the inputs of a difference amplifier.

13. A power detector according to claim 1, wherein:
    one detection position is connected via a detector diode and
    another detection position is connected via a resistance to the inputs of a difference amplifier.

14. A power detector according to claim 1, wherein:
    no isolating capacitor is present between the high-frequency input and the signal line.

15. A power detector according to claim 1, wherein:
    the signal line terminates with a terminal resistance having a value approximately corresponding to the line impedance of the signal line.

16. A power detector according to claim 1, further comprising:
    a power distributor connected to the signal line.

17. A power detector according to claim 16, wherein:
    at least two measurement branches are connected to the power distributor, with one signal line each connected via attenuation elements to one of the outputs of the power distributor and one detection line coupled to the signal line in a capacitive and/or inductive manner, only at most one contact position along the longitudinal direction and is otherwise electrically isolated from the signal line; and
    the signal on each detection line is tapped at least at two detection positions offset in the longitudinal direction.

18. A power detector for measuring direct-voltage-free power comprising:
    a signal line connected to a high-frequency input; and
    a detection line coupled to the signal line in a firm capacitive and/or inductive manner such that, with reference to the longitudinal coordinate, a similar voltage distribution of a high-frequency signal is present on the detection line as on the signal line, wherein the signal on the detection line is tapped at least at two detection positions offset in a longitudinal direction,
    wherein the signal line and the detection line are striplines arranged one above the other and isolated from one another by a thin insulation layer except at one contact position.

19. A power detector for measuring direct-voltage-free power comprising:
    a signal line connected to a high-frequency input; and
    a detection line coupled to the signal line in a firm capacitive and/or inductive manner such that, with reference to the longitudinal coordinate, a similar voltage distribution of a high-frequency signal is present on the detection line as on the signal line, wherein the signal on the detection line is tapped at least at two detection positions offset in a longitudinal direction,
    wherein the signal line and the detection line are coupled to form a two-wire line with a line impedance approximately equivalent to the direct current resistance of the signal line.

* * * * *